United States Patent
Matsushima

(10) Patent No.: US 11,692,118 B2
(45) Date of Patent: Jul. 4, 2023

(54) THERMALLY CONDUCTIVE RESIN COMPOSITION AND THERMALLY CONDUCTIVE SHEET USING THE SAME

(71) Applicant: DEXERIALS CORPORATION, Shimotsuke (JP)

(72) Inventor: Masayuki Matsushima, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

(21) Appl. No.: 17/626,638

(22) PCT Filed: May 24, 2021

(86) PCT No.: PCT/JP2021/019617
§ 371 (c)(1),
(2) Date: Jan. 12, 2022

(87) PCT Pub. No.: WO2021/261147
PCT Pub. Date: Dec. 30, 2021

(65) Prior Publication Data
US 2022/0298402 A1    Sep. 22, 2022

(30) Foreign Application Priority Data

Jun. 26, 2020  (JP) ................................. 2020-110874

(51) Int. Cl.
| | |
|---|---|
| *C09K 5/14* | (2006.01) |
| *C08G 77/04* | (2006.01) |
| *C08K 5/29* | (2006.01) |
| *C08K 9/06* | (2006.01) |
| *C08L 83/04* | (2006.01) |
| *C08K 5/5419* | (2006.01) |
| *C08K 3/28* | (2006.01) |
| *C08K 3/22* | (2006.01) |

(52) U.S. Cl.
CPC .............. *C09K 5/14* (2013.01); *C08G 77/04* (2013.01); *C08K 3/28* (2013.01); *C08K 5/29* (2013.01); *C08K 5/5419* (2013.01); *C08K 9/06* (2013.01); *C08L 83/04* (2013.01); *C08K 2003/222* (2013.01); *C08K 2003/2227* (2013.01); *C08K 2003/282* (2013.01); *C08K 2201/001* (2013.01)

(58) Field of Classification Search
CPC ...... C08L 83/04; C08K 2003/282; C08K 5/29
See application file for complete search history.

(56) References Cited

U.S. PATENT DOCUMENTS

| | | | | |
|---|---|---|---|---|
| 5,741,839 | A | * | 4/1998 | Scheim ................ C08K 5/5465 524/588 |
| 2019/0292349 | A1 | * | 9/2019 | Ito ........................... C08L 83/14 |
| 2022/0119619 | A1 | * | 4/2022 | Yukutake ................. C08K 3/22 |
| 2022/0135805 | A1 | * | 5/2022 | Otsuka ................ C01B 21/0728 523/206 |

FOREIGN PATENT DOCUMENTS

| | | |
|---|---|---|
| CN | 103665850 A | 3/2014 |
| JP | 3290127 B2 | 6/2002 |
| JP | 2005-029643 A | 2/2005 |
| JP | 2009-120732 A | 6/2009 |
| JP | 2013-053278 A | 3/2013 |
| JP | 6008706 B2 | 10/2016 |
| JP | 6194861 B2 | 9/2017 |
| WO | 2004-058896 A1 | 7/2004 |
| WO | 2017-002474 A1 | 1/2017 |
| WO | 2017-043070 A1 | 3/2017 |
| WO | WO 2021/020540 * | 2/2021 |

OTHER PUBLICATIONS

Jul. 27, 2021 Search Report issued in International Patent Application No. PCT/JP2021/019617.
Jul. 27, 2021 Written Opinion of the International Searching Authority issued in International Patent Application No. PCT/JP2021/019617.
Oct. 20, 2022 Office Action issued in Chinese Patent Application No. 2021800028240.
Mar. 20, 2023 Office Action issued in Korean Patent Application No. 10-2021-7032207.

* cited by examiner

*Primary Examiner* — Marc S Zimmer
(74) *Attorney, Agent, or Firm* — Oliff PLC

(57) ABSTRACT

A thermally conductive resin composition capable of maintaining high thermal conductivity and a thermally conductive sheet using the same, a thermally conductive resin composition contains an addition reaction type silicone resin, a thermally conductive filler, an alkoxysilane compound, and a carbodiimide compound in which a subcomponent is in an inactive state with respect to an alkoxysilane compound, and contains 55 to 85% by volume of the thermally conductive filler. A thermally conductive resin composition contains an addition reaction type silicone resin, an alkoxysilane compound, a thermally conductive filler, and a carbodiimide compound in which a subcomponent is in an inactive state with respect to the alkoxysilane compound, and exhibits thermal conductivity of 5 W/m*K or more after curing.

14 Claims, No Drawings

THERMALLY CONDUCTIVE RESIN COMPOSITION AND THERMALLY CONDUCTIVE SHEET USING THE SAME

TECHNICAL FIELD

The present technology relates to a thermally conductive resin composition and a thermally conductive sheet using the same. This application claims priority based on Japanese Patent Application No. 2020-110874, filed Jun. 26, 2020, in Japan, which is incorporated herein by reference.

BACKGROUND ART

In recent years, as the power density of semiconductor devices increases, materials used in the devices are required to have more excellent heat dissipation characteristics. In order to achieve more excellent heat dissipation characteristics, there is used a material called a thermal interface material, in various forms such as a sheet, a gel, and a grease, for reducing the thermal resistance of a path for releasing heat generated by a semiconductor element to a heat sink or a housing.

Generally, examples of the thermal interface material include, for example, a composite material (a thermally conductive resin composition) in which a thermally conductive filler is dispersed in an epoxy resin or a silicone resin. As the thermally conductive filler, metal oxides and metal nitrides are often used. Further, silicone resin, which is an example of the resin, is widely used from the viewpoint of heat resistance and flexibility.

In recent years, high thermal conductivity has been required for a thermally conductive sheet due to high-density mounting of a semiconductor element or the like and an increase in heat generation. To solve this problem, for example, it is conceivable to increase the amount of the thermally conductive filler in the thermally conductive resin composition.

However, in a thermally conductive resin composition containing, for example, an addition reaction type silicone resin as a binder component, an impurity (e.g., ionic components, organic compounds containing elements such as N, P, and S, and metals such as Sn, Pb, Hg, Sb, Bi, and As) in the thermally conductive filler tends to inhibit a catalyst (e.g., a platinum catalyst) reaction used for the addition reaction of the addition reaction type silicone resin.

In order to further increase the amount of the thermally conductive filler to be added, it is effective to add an alkoxysilane compound such as a so-called silane coupling agent having an alkyl group or a reactive functional group to the thermally conductive resin composition. The alkoxysilane compound is hydrolyzed to a silanol, which is bonded to the surface of the thermally conductive filler to contribute to the dispersibility of the thermally conductive filler in the thermally conductive resin composition. However, the alkoxysilane compound may cause mutual hydrolysis of the remaining alkoxysilane compounds not bonded to the surface of the thermally conductive filler and mutual dehydration condensation (condensation polymerization) of silanols.

Therefore, when the content of the thermally conductive filler in the thermally conductive resin composition containing the addition reaction type silicone resin as a binder component increases, the addition reaction type silicone resin tends not to be cured sufficiently, and in addition, the content of the addition reaction type silicone resin relatively decreases, so that the oxidizing action of the addition reaction type silicone resin tends to proceed under a high temperature environment. Further, due to the reactions including the mutual hydrolysis of the remaining alkoxysilane compounds and the mutual dehydration condensation of the silanols, in a thermally conductive sheet using the thermally conductive resin composition containing the addition reaction type silicone resin as a binder component, initial flexibility is lost during long-term use at a high temperature, and adhesion of a contact surface with a heat source tends to decrease, so that contact resistance might increase to degrade the essential performance of the thermally conductive sheet.

Therefore, in a thermally conductive resin composition containing an addition reaction type silicone resin as a binder component, in order to suppress the oxidizing action of the addition reaction type silicone resin under a high temperature environment while maintaining the flexibility when the thermally conductive resin composition is formed into a sheet, the upper limit of the content of the thermally conductive filler in the thermally conductive resin composition is limited to such an extent that the thermal conductivity of the thermally conductive sheet composed of the cured product of the thermally conductive resin composition exhibits about 3 W/m*K.

CITATION LIST

Patent Literature

Patent Document 1: International Publication No. WO 2017/002474
Patent Document 2: Japanese Patent No. 6008706
Patent Document 3: Japanese Patent No. 6194861
Patent Document 4: Japanese Patent No. 3290127

SUMMARY OF INVENTION

Technical Problem

In view of such conventional circumstances, an object of the present technology is to provide a thermally conductive resin composition capable of maintaining high thermal conductivity and a thermally conductive sheet using the same.

Solution to Problem

As a result of intensive studies, the present inventors have found that the deterioration of the thermally conductive resin composition can be suppressed and the above-mentioned problem can be solved by further adding a carbodiimide compound the subcomponent of which is inactive to the alkoxysilane compound to a thermally conductive resin composition containing an addition type silicone resin, a thermally conductive filler, and an alkoxysilane compound.

In other words, a thermally conductive resin composition according to the present technology contains: an addition reaction type silicone resin; a thermally conductive filler; an alkoxysilane compound; and a carbodiimide compound the subcomponent of which is inactive to the alkoxysilane compound, wherein the thermally conductive resin composition contains 55 to 85% by volume of the thermally conductive filler.

A thermally conductive resin composition according to the present technology contains: an addition reaction type silicone resin; a thermally conductive filler; an alkoxysilane compound; and a carbodiimide compound the subcomponent of which is inactive to the alkoxysilane compound, wherein the thermally conductive resin composition exhibits a thermal conductivity of 5 W/m*K or more after curing.

A thermally conductive sheet according to the present technology comprises a cured product of the above-described thermally conductive resin composition.

Advantageous Effects of Invention

According to this technology, it is possible to provide a thermally conductive resin composition capable of maintaining high thermal conductivity and a thermally conductive sheet using the same.

DESCRIPTION OF EMBODIMENTS

Thermally Conductive Resin Composition

A thermally conductive resin composition according to the present technology contains: an addition reaction type silicone resin; a thermally conductive filler; an alkoxysilane compound; and a carbodiimide compound the subcomponent of which is inactive to the alkoxysilane compound (hereinafter also referred to as a "specific carbodiimide compound"), wherein the thermally conductive resin composition contains 55 to 85% by volume of the thermally conductive filler.

As described above, in the thermally conductive resin composition according to the present technology, by adding a carbodiimide compound the subcomponent of which is inactive to the alkoxysilane compound to a thermally conductive resin composition containing an addition type silicone resin, a thermally conductive filler, and an alkoxysilane compound, it is possible to maintain high thermal conductivity even when a thermally conductive resin composition containing 55 to 85 vol % of the thermally conductive filler is formed into a thermally conductive sheet.

The reason why the effect of this technology can be achieved is estimated as follows. In the thermally conductive resin composition containing an addition type silicone resin, a thermally conductive filler, an alkoxysilane compound, and a specific carbodiimide compound, it is inferred that, when a silanol derived from an alkoxysilane compound or the like exists, condensation polymerization by the silanol occurs, which will cause, along with the oxidation reaction by impurities or the like of the thermally conductive filler at a high temperature, deterioration of the addition reaction-type silicone resin. With regard to this, it is considered that, in the thermally conductive resin composition according to the present technology, the specific carbodiimide compound functions as a silanol condensing agent (formation of —Si—O—Si—) by the reaction of the specific carbodiimide compound on a silanol derived from an alkoxysilane compound or the like, thereby suppressing deterioration of the thermally conductive resin composition derived from the silanol, and as a result, high thermal conductivity can be maintained when the thermally conductive resin composition is formed into a thermally conductive sheet.

Hereinafter, each component constituting the thermally conductive resin composition will be described in detail.

Addition Reaction Type Silicone Resin

The thermally conductive resin composition according to the present technology uses a silicone resin as a binder resin because it has excellent moldability and weather resistance, as well as good adhesiveness and followability to electronic components. In particular, from the viewpoint of improving moldability, weather resistance, and adhesion, it is preferable to use a silicone resin comprising a main agent of a liquid silicone gel and a curing agent. Examples of such silicone resins include an addition reaction type silicone resin, a heat vulcanization type millable silicone resin (millable rubber) using a peroxide for vulcanization. In particular, when the thermally conductive resin composition is applied to a thermally conductive sheet to be sandwiched between a heat-generating element and a heat dissipating member, because adhesion between, for example, a heat-generating surface of an electronic component and a heat sink surface is required, an addition reaction type silicone resin (addition reaction type liquid silicone resin) is preferable.

Examples of the addition reaction type silicone resin include a two-part addition reaction type silicone resin containing (i) a silicone having an alkenyl group as a main component, (ii) a main agent containing a curing catalyst, and (iii) a curing agent having a hydrosilyl group (Si—H group).

(i) As the silicone having an alkenyl group, for example, an organopolysiloxane having a vinyl group can be used. (ii) The curing catalyst is a catalyst for promoting the addition reaction between (i) an alkenyl group in the silicone having the alkenyl group and (iii) a hydrosilyl group in the curing agent having the hydrosilyl group. (ii) Examples of the curing catalyst includes a catalyst known as a catalyst used in the hydrosilylation reaction such as a platinum group-based curing catalyst such as a single platinum group metal such as platinum, rhodium, and palladium or platinum chloride. (iii) Examples of the curing agent having a hydrosilyl group includes an organopolysiloxane having a hydrosilyl group.

Here, in the presence of water or a catalyst (e.g., platinum), the Si—H group portion of the curing agent having a hydrosilyl group may become a Si—OH group, and the silanol may be condensed. In the thermally conductive resin composition according to the present technology, in a case of using a two-part addition reaction type silicone resin is used, when a silanol derived from a curing agent having a hydrosilyl group and a silanol derived from an alkoxysilane compound are condensed, a three-dimensional hard cured product might be produced, which might seriously deteriorate the whole thermally conductive resin composition. With regard to this, in the thermally conductive resin composition according to the present technology, by making a specific carbodiimide compound act on a silanol derived from an alkoxysilane compound or the like, condensation of the silanol derived from the alkoxysilane compound is promoted by the specific carbodiimide compound before the silanol derived from a curing agent having a hydrosilyl group reacts with the silanol derived from the alkoxysilane compound, thereby suppressing the deterioration of the thermally conductive resin composition.

As the addition reaction type silicone resin, a desired commercially available product can be used in consideration of hardness of a cured product obtained by curing the thermally conductive resin composition. Examples include CY52-276, CY52-272, EG-3100, EG-4000, EG-4100, 527 (all of the above manufactured by Dow Corning Toray), KE-1800T, KE-1031, KE-1051J (all of the above manufactured by Shin-Etsu Chemical). The addition reaction type silicone resin may be used alone or in combination of two or more.

Thermally Conductive Filler

The thermally conductive filler may be selected from known materials in view of desired thermal conductivity and fillability. Examples of the thermally conductive filler include metal hydroxides such as aluminum hydroxide and magnesium hydroxide, metals such as aluminum, copper, and silver, metal oxides such as alumina and magnesium oxide, metal nitrides such as aluminum nitride, boron nitride, and silicon nitride, carbon nanotubes, metallic silicon, and fiber fillers (glass fiber and carbon fiber). The thermally conductive filler may be used alone or in combination of two or more.

The thermally conductive resin composition according to the present technology preferably contains an inorganic filler as a thermally conductive filler, more preferably contains a nitrogen compound, and yet more preferably contains a nitrogen compound having a thermal conductivity of 60 W/m*K or more, from the viewpoint of achieving, for example, an excellent flame retardancy. The nitrogen compound is preferably aluminum nitride or boron nitride, and more preferably aluminum nitride. The thermally conductive resin composition according to the present technology may contain, as a thermally conductive filler, at least one of aluminum nitride, metal hydroxide, metal oxide, and carbon fiber. Examples of the metal hydroxide and the metal oxide include aluminum hydroxide, alumina, aluminum nitride, and magnesium oxide. For example, as the thermally conductive filler, only alumina, only aluminum nitride, or only carbon fibers may be used. In particular, in the thermally conductive resin composition according to the present technology, from the viewpoints of flame retardancy and heat conductivity, it is preferable to use, as the thermally conductive filler, at least aluminum nitride, more preferably a mixture of aluminum nitride, alumina, and magnesium oxide, and this mixture may further contain carbon fibers. A mixture of aluminum nitride, carbon fiber, and zinc oxide may be used as the thermally conductive filler. The thermally conductive filler preferably contains water to a degree contributing to the hydrolysis of the alkoxysilane compound. More specifically, it is preferable that the content of the thermally conductive filler is the same as that of water to be absorbed from air, for example. Here, it has been reported that alumina, which is an example of a thermally conductive filler, has a maximum annual moisture absorption fluctuation range of less than 0.3% (equilibrium moisture content) in Japan. Therefore, the water content of the thermally conductive filler used in the present technology is preferably, for example, 0.3% or less.

The content of the thermally conductive filler in the thermally conductive resin composition can be appropriately determined according to a desired thermal conductivity or the like, and the volume content in the thermally conductive resin composition can be 55 to 85% by volume. When the content of the thermally conductive filler in the thermally conductive resin composition is less than 55% by volume, the thermal conductivity tends to be insufficient. When the content of the thermally conductive filler in the thermally conductive resin composition exceeds 85% by volume, the filling of the thermally conductive filler tends to be difficult. The content of the thermally conductive filler in the thermally conductive resin composition may be 70% by volume or more or 80% by volume or less. When two or more kinds of thermally conductive fillers are used in combination, the total amount thereof preferably satisfies the above content range.

When the thermally conductive filler contains aluminum nitride, the content of aluminum nitride in the thermally conductive filler may be 1 to 100% by volume.

Alkoxysilane Compound

The thermally conductive resin composition contains an alkoxysilane compound. The alkoxysilane compound is hydrolyzed in the thermally conductive resin composition, for example, with moisture to a degree included in the thermally conductive filler and bonded to the thermally conductive filler to contribute to dispersion of the thermally conductive filler. The alkoxysilane compound has a structure in which one to three of the four valence electrons of a silicon atom (Si) are bonded to an alkoxy group and the remaining valence electrons are bonded to an organic substituent.

The alkoxy group of the alkoxysilane compound includes, for example, a methoxy group, an ethoxy group, a protoxy group, a butoxy group, a pentoxy group, and a hexatoxy group. The alkoxysilane compound is preferably an alkoxysilane compound having a methoxy group or an ethoxy group from the viewpoint of availability. The number of alkoxy groups of the alkoxysilane compound is preferably two or more, and more preferably three from the viewpoint of enhancing affinity with the thermally conductive filler as an inorganic substance. As a specific example of the alkoxysilane compound, at least one selected from a trimethoxysilane compound and a triethoxysilane compound is preferable.

The functional group contained in the organic substituent of the alkoxysilane compound includes, for example, an acryloyl group, an alkyl group, a carboxyl group, a vinyl group, a methacrylic group, an aromatic group, an amino group, an isocyanate group, an isocyanurate group, an epoxy group, a hydroxyl group, and a mercapto group. Here, when an addition reaction type organopolysiloxane containing, for example, a platinum catalyst is used as the precursor of the above addition reaction type silicone resin, it is preferable that the alkoxysilane compound hardly affects the curing reaction of the organopolysiloxane. Specifically, when an addition reaction type organopolysiloxane containing a platinum catalyst is used, it is preferable that the organic substituent of the alkoxysilane compound does not contain an amino group, an isocyanate group, an isocyanurate group, a hydroxyl group, or a mercapto group.

An alkylalkoxysilane compound having an alkyl group bonded to a silicon atom, in other words, an alkyl group-containing alkoxysilane compound is preferable from the viewpoint of enhancing the dispersibility of the thermally conductive filler to facilitate the filling of the thermally conductive filler at a higher level. In the alkoxy silane compound containing an alkyl group, the carbon number of the alkyl group bonded to the silicon atom is preferably 4 or more, may be 6 or more, may be 8 or more, and may be 10 or more. In order to further reduce the viscosity of the thermally conductive resin composition, the number of carbon atoms of the alkyl groups bonded to silicon atoms in the alkyl group-containing alkoxysilane compound is preferably 16 or less, may be 14 or less, and may be 12 or less. In the alkyl group-containing alkoxysilane compound, the alkyl group bonded to the silicon atom may be straight chain, branched, or cyclic.

The alkoxysilane compound may be used alone or in combination of two or more. Specific examples of the alkoxysilane compound include, in addition to the alkyl group-containing alkoxysilane compound, a vinyl group-containing alkoxysilane compound, an acryloyl group-containing alkoxysilane compound, a methacrylic group-containing alkoxysilane compound, an aromatic group-containing alkoxysilane compound, an amino group-containing alkoxysilane compound, an isocyanate group-containing alkoxysilane compound, an isocyanurate group-containing alkoxysilane compound, an epoxy group-containing alkoxysilane compound, and a mercapto group-containing alkoxysilane compound.

Examples of alkyl group-containing alkoxysilane compounds include methyltrimethoxysilane, dimethyldimethoxysilane, trimethylmethoxysilane, methyltriethoxysilane, dimethyldiethoxysilane, ethyltrimethoxysilane, n-propyltrimethoxysilane, n-propyltriethoxysilane, isobutyltrimethoxysilane, isobutyltriethoxysilane, n-hexyltrimethoxysilane, n-hexyltriethoxysilane, cyclohexylmethyldimethoxysilane, n-octyltriethoxysilane, n-decyltrimethoxysilane, and hexadecyltrimethoxysilane, among others. Among the alkyl group-containing alkoxysilane compounds, at least one selected from isobutyltrimethoxysilane, isobutyltriethoxysilane, n-hexyltrimethoxysilane, n-hexyltriethoxysilane, cyclohexylmethyldimethoxysilane, n-octyltriethoxysilane, n-decyltrimethoxysilane, and hexadecyltrimethoxysilane is preferable, and at least one selected from n-decyltrimethoxysilane and hexadecyltrimethoxysilane is more preferable.

Examples of the vinyl group-containing alkoxysilane compound include vinyltrimethoxysilane and vinyltriethoxysilane.

Examples of the acryloyl group-containing alkoxysilane compound include, for example, 3-acryloxypropyltrimethoxysilane.

Examples of the methacrylic group-containing alkoxysilane compound include 3-methacryloxypropylmethyldimethoxysilane, 3-methacryloxypropyltrimethoxysilane, and 3-methacryloxypropyltriethoxysilane.

Examples of the aromatic group-containing alkoxysilane compound include phenyltrimethoxysilane and phenyltriethoxysilane.

Examples of amino group-containing alkoxysilane compounds include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, and N-phenyl-3-aminopropyltrimethoxysilane.

Examples of the isocyanate group-containing alkoxysilane compound include 3-isocyanate propyltriethoxysilane. Examples of the isocyanurate group-containing alkoxysilane compound include tris-(trimethoxysilylpropyl) isocyanurate.

Examples of the epoxy group-containing alkoxysilane compound include 2-(3,4-epoxycyclohexyl) ethyltrimethoxysilane, 3-glycidoxypropylmethyldimethoxysilane, 3-glycidoxypropyltrimethoxysilane, and 3-glycidoxypropyltriethoxysilane.

Examples of the mercapto group-containing alkoxysilane compound include 3-mercaptopropyltrimethoxysilane.

The content of the alkoxysilane compound in the thermally conductive resin composition is not particularly limited, but may be, for example, 0.1 to 2.0 parts by weight, more preferably 0.2 to 1.0 parts by weight with respect to 100 parts by weight of the thermally conductive filler. When two or more kinds of alkoxysilane compounds are used in combination, it is preferable that the total amount of the alkoxysilane compounds satisfies the above content range.

Carbodiimide Compound

The thermally conductive resin composition contains a specific carbodiimide compound, in other words, a carbodiimide compound the subcomponent of which is inactive to the alkoxysilane compound described above. As described above, the reaction of silanol with a specific carbodiimide compound in the thermally conductive resin composition is considered to contribute to maintaining high thermal conductivity when the thermally conductive resin composition is formed into a thermally conductive sheet.

With regard to a carbodiimide compound the subcomponent of which is inactive to the alkoxysilane compound, the term "carbodiimide compound" means a compound having a carbodiimide group (—N=C=N—). Further, the "subcomponent" includes, for example, water component (aqueous solution or water) and components other than water active to the alkoxysilane compound. The phrase "carbodiimide compound the subcomponent of which is inactive to the alkoxysilane compound" means that the carbodiimide compound substantially contains no subcomponent.

As described above, the alkoxysilane compounds used in the present technology require water for reaction with the thermally conductive filler. On the other hand, alkoxysilane compounds themselves can react with each other via water. Among the commercially available carbodiimide compounds, there are also carbodiimide compounds which are provided, for example, in a form of an emulsion in an aqueous solution or water. When the thermally conductive resin composition is left for a long time for curing, such a carbodiimide compound provided in a state where an emulsion is formed in an aqueous solution or water might cause adverse effects due to moisture derived from the carbodiimide compound.

Therefore, in view of the application of the thermally conductive resin composition of the present technology, it is preferable that the carbodiimide compound does not contain a large amount of water as the subcomponent. For example, the content of the subcomponent in the specific carbodiimide compound is preferably 45 wt % or less, may be 30 wt % or less, may be 10 wt % or less, may be 5 wt % or less, and may be substantially 0 wt %. That is, the specific carbodiimide compound is preferably a carbodiimide compound that is solid at ordinary temperature, and more preferably a carbodiimide compound having a solid content of 100%. In this specification, "ordinary temperature" refers to a range of 15 to 25° C. as specified in JIS K 0050: 2019 (General Rules for Chemical Analysis).

The carbodiimide compound that is liquid at ordinary temperature is more reactive than the carbodiimide compound that is solid at ordinary temperature. Therefore, when a carbodiimide compound that is liquid at ordinary temperature is used, for example, the condensation of the silanol is advanced at the time of kneading the thermally conductive resin composition, and the curing tends to advance before the thermally conductive resin composition is formed into a sheet. In contrast, the carbodiimide compound that is solid at ordinary temperature is bulky and has lower reactivity as compared with the carbodiimide compound liquid at ordinary temperature. Therefore, when using the carbodiimide compound that is solid at the ordinary temperature, the curing during the kneading of the thermally conductive resin composition tends to be slower as compared with when using the carbodiimide compound that is liquid at the ordinary temperature, so that the effect of the present technology can be more effectively exhibited after the thermally conductive resin composition is formed into a sheet. When the thermally conductive resin composition further contains an antioxidant to be described later, the carbodiimide compound that is solid at ordinary temperature tends to have less influence on the curing as compared with the carbodiimide compound that is liquid at ordinary temperature.

Further, for example, in a thermally conductive resin composition containing a nitrogen compound (for example, aluminum nitride) having a thermal conductivity of 60 W/m*K or more as a thermally conductive filler, when a carbodiimide compound containing a subcomponent (a large amount of water) is used, ammonia gas is generated and aluminum hydroxide is generated by the subcomponent contained in the carbodiimide compound as shown in the following Formula 1, and there arises a risk of a decrease in thermal conductivity when the thermally conductive resin composition is formed into a thermally conductive sheet and an environmental deterioration in compounding work.

$$AlN + 3H_2O \rightarrow Al(OH)_3 + NH_3 \quad \text{Formula 1}$$

On the contrary, by using a specific carbodiimide compound, that is, a carbodiimide compound the subcomponent of which is inactive to an alkoxysilane compound, it is possible to suppress the generation of ammonia gas derived from the subcomponent more effectively to suppress the deterioration of the thermally conductive resin composition, thereby maintaining high thermal conductivity more effectively when the thermally conductive resin composition is formed into a thermally conductive sheet. The carbodiimide compound that is solid at ordinary temperature, which is an example of a specific carbodiimide compound, has a relatively larger molecular weight than the carbodiimide compound that is liquid at ordinary temperature, and is considered to have a relatively lower reactivity than the carbodiimide compound that is liquid at ordinary temperature, so that the carbodiimide compound that is solid at ordinary temperature is preferable from the viewpoint of workability in kneading the composition.

In the specific carbodiimide compound, the group bonded to the carbodiimide group is not particularly limited, and examples thereof may include an aliphatic group, an alicyclic group, an aromatic group, and a group in which these organic groups are bonded (e.g., benzyl group, phenethyl group, and 1,4-xylylene group).

From the viewpoint that the carbodiimide compound does not contain a large amount of water as a subcomponent as described above, preferred commercially available products of the specific carbodiimide compound include CARBOSISTA (manufactured by Teijin), CARBODILITE V-05 (manufactured by Nisshinbo Chemical) which is a solvent-soluble type polycarbodiimide resin (solid 100%), and Elastostab H01 (manufactured by BASF Polyurethanes GmbH).

The specific carbodiimide compound is preferably a cyclic carbodiimide compound having a carbodiimide group in a cyclic structure from the viewpoint of suppressing the generation of isocyanate gas accompanying the reaction of the carbodiimide group. By using such a cyclic carbodiimide compound, it is possible to further improve the working environment, such as when kneading the thermally conductive resin composition. Examples of cyclic carbodiimide compounds include, for example, the cyclic carbodiimide compound (a) described in WO 2010/071212, page 13 to 17, the cyclic carbodiimide compound (b) described in the same publication, age 18 to 19, and the cyclic carbodiimide compound (c) described in the same publication, page 22 to 23, and the contents of which are incorporated herein. The structure of the carbodiimide compound is excellent in heat resistance and reactivity at low temperatures, and contributes more effectively to the stability in the operating temperature range of the thermally conductive resin composition of the present technology and to the suppression of the mutual hydrolysis of the alkoxysilane compounds as described above. Commercially available cyclic carbodiimide compounds that can be used in the present technology include, for example, the aforementioned CARBOSISTA (manufactured by Teijin).

The content of the carbodiimide compound in the thermally conductive resin composition is not particularly limited, but it is preferable to consider, for example, the amount of silanol generated by the mutual hydrolysis of the remaining alkoxysilane compounds which is not bonded to the surface of the thermally conductive filler as described above.

For example, the content of the carbodiimide compound in the thermally conductive resin composition may be 0.1 to 2.0 parts by weight with respect to 100 parts by weight of the components other than the thermally conductive filler. When two or more kinds of dispersants having a specific structure are used in combination, it is preferable that the total amount thereof satisfies the above content range.

Antioxidant

The thermally conductive resin composition according to the present technology may further contain an antioxidant in addition to the above-described components in order to further enhance the effect of the present technology. As the antioxidant, for example, a hindered phenol-based antioxidant may be used, or a hindered phenol-based antioxidant and a sulfur-based antioxidant may be used in combination. The hindered phenol-based antioxidant captures, for example, radicals (peroxy radicals) to effectively contributes to the suppression of the oxidative deterioration of the addition reaction type silicone resin. The sulfur-based antioxidant decomposes, for example, a hydroxide radical to effectively contribute to the suppression of the oxidative deterioration of the addition reaction type silicone resin.

Hindered Phenol-Based Antioxidant

Examples of the hindered phenol-based antioxidant include a one having a structure represented by the following Formula 2 as a hindered phenol skeleton. The hindered phenol-based antioxidant preferably has one or more skeletons represented by Formula 2, and may have two or more skeletons represented by Formula 2.

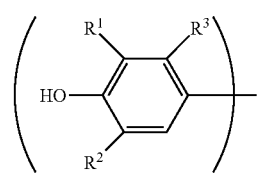

Formula 2

In Formula 2, it is preferable that $R^1$ and $R^2$ represent a t-butyl group, and $R^3$ represents a hydrogen atom (hindered type), or $R^1$ represents a methyl group, $R^2$ represents a t-butyl group, and $R^3$ represents a hydrogen atom (semi-hindered type), or $R^1$ represents a hydrogen atom, $R^2$ represents a t-butyl group, and $R^3$ represents a methyl group (less hindered type). From the viewpoint of long-term thermal stability under a high temperature environment, a semi-hindered type or a hindered type is preferable. The hindered phenol-based antioxidant preferably has three or more skeletons represented by Formula 2 described above in one molecule, wherein the three or more skeletons represented by Formula 2 are connected by a hydrocarbon group or a group consisting of a combination of a hydrocarbon group, —O—, and —CO—. The hydrocarbon group may be linear, branched, or cyclic. The carbon number of the hydrocarbon group can be, for example, 3 to 8. The molecular weight of the hindered phenol-based antioxidant may be, for example, 300 to 850 or 500 to 800.

The hindered phenol-based antioxidant preferably has an ester bond in its structure. Using a hindered phenol-based antioxidant having an ester bond can prevent oxidation of the addition reaction type silicone resin more effectively. Examples of such phenol-based antioxidants include 3-(3,5-di-tert-butyl-4-hydroxyphenyl) propionic acid stearyl, tetrakis [3-(3',5'-di-t-butyl-4'-hydroxyphenyl) propionic acid] pentaerythritol, and 2,2'-dimethyl-2,2'-(2,4,8,10-tetraoxaspiro [5.5] undecane-3,9-diyl) dipropane-1,1'-diyl=bis [3-(3-tert-butyl-4-hydroxy-5-methylphenyl) propanoate], among others. As the hindered phenol-based antioxidant, it is possible to use a compound having no ester bond in its structure, for example, 1,1,3-tris (2-methyl-4-hydroxy-5-t-butylphenyl) butane.

Commercially available phenol-based antioxidants include Adekastab AO-30, Adekastab AO-50, Adekastab AO-60, Adekastab AO-80 (all of the above manufactured by ADEKA), Irganox 1010, Irganox 1035, Irganox 1076, Irganox 1135 (all of the above manufactured by BASF). The phenol-based antioxidant may be used alone or in combination of two or more.

When the phenol-based antioxidant is contained in the thermally conductive resin composition, the lower limit of the content of the phenol-based antioxidant may be, for example, 0.1 parts by weight or more, preferably 0.5 parts by weight or more, with respect to 100 parts by weight of the addition reaction type silicone resin. The upper limit of the content of the phenol-based antioxidant may be, for example, 10 parts by weight or less, preferably 5 parts by weight or less, with respect to 100 parts by weight of the addition reaction type silicone resin. When two or more kinds of phenol-based antioxidants are used in combination, it is preferable that the total amount thereof satisfies the above content range.

Sulfur-Based Antioxidant

Examples of the sulfur-based antioxidant include a type having a thioether skeleton and a type having a hindered phenol skeleton. Examples of the sulfur-based antioxidant include 3,3'-thiobispropionic acid ditridecyl, tetrakis [3-(dodecylthio) propionic acid] pentaerythritol, 4,6-bis (octyl-thiomethyl)-o-cresol.

Commercially available sulfur-based antioxidants include Adekastab AO-412S, Adekastab AO-503, Adekastab AO-26 (all of the above manufactured by ADEKA), Sumilizer TP-D (manufactured by Sumitomo Chemical), Irganox 1520L (manufactured by BASF Japan). Among these sulfur-based antioxidants, from the viewpoint of less curing inhibition, it is preferable to use tetrakis [3-(dodecylthio) propionic acid] pentaerythritol (commercially available products: Adekastab AO-412S, Sumilizer TP-D (manufactured by Sumitomo Chemical), and Irganox 1520L. The sulfur-based antioxidant may be used alone or in combination of two or more.

When the sulfur-based antioxidant is contained in the thermally conductive resin composition, the content of the sulfur-based antioxidant in the thermally conductive resin composition is preferably about the same as or larger than that of the phenol-based antioxidant. For example, the lower limit of the content of the sulfur-based antioxidant may be, for example, 0.1 parts by weight or more with respect to 100 parts by weight of the addition reaction type silicone resin. The upper limit of the content of the sulfur-based antioxidant may be, for example, 20 parts by weight or less, preferably 10 parts by weight or less with respect to 100 parts by weight of the addition reaction type silicone resin. When two or more kinds of sulfur-based antioxidants are used in combination, it is preferable that the total amount thereof satisfies the above content range.

As described above, the thermally conductive resin composition according to the present technology contains an addition reaction type silicone resin, 55 to 85% by volume of a thermally conductive filler, an alkoxysilane compound, and a specific carbodiimide compound. Thus, by using the addition reaction type silicone resin, the thermally conductive filler, the alkoxysilane compound, and the specific carbodiimide compound in combination, the synergistic effect makes it possible to maintain high thermal conductivity when the thermally conductive resin composition containing 55 to 85% by volume of the thermally conductive filler is formed into a thermally conductive sheet. Further, in the thermally conductive resin composition according to the present technology, it is also possible to suppress the oxidizing action of the addition reaction type silicone resin under a high temperature environment while maintaining the flexibility when formed into a sheet.

Further, the thermally conductive resin composition according to the present technology may contain an addition reaction type silicone resin, a thermally conductive filler, an alkoxysilane compound, and a specific carbodiimide compound, and the thermal conductivity after curing may be 5 W/m*K or more. Such an embodiment can also achieve the effect of the present technology.

It should be noted that the thermally conductive resin composition according to the present technology may further contain components other than the above components within a range not impairing the effect of the present technology.

The thermally conductive resin composition according to the present technology can be obtained, for example, by kneading the above-mentioned components using a kneader (such as a planetary mixer, a ball mill, and a Henschel mixer). In a case where a two-component addition reaction type silicone resin is used as the addition reaction type silicone resin that is a binder resin, instead of mixing the main agent, the curing agent, and the thermally conductive filler at the same time, a required amount of the thermally conductive filler may be divided and mixed into the main agent and the curing agent respectively, and the component containing the main agent and the component containing the curing agent may be mixed at the time of use.

Thermally Conductive Sheet

The thermally conductive sheet according to the present technology comprises a cured product of the thermally conductive resin composition described above. By using the aforementioned thermally conductive resin composition, the thermally conductive sheet according to the present technology can have a thermal conductivity of 3.0 W/m*K or higher, 3.5 W/m*K or higher, 4.0 W/m*K or higher, 4.5 W/m*K or higher, 5.0 W/m*K or higher, and 6.0 W/m*K or higher. The upper limit of the thermal conductivity of the thermally conductive sheet is not particularly limited, but may be, for example, 15.0 W/m*K or less, or 7.0 W/m*K or less.

Further, in the thermally conductive sheet according to the present technology, when aged at 200° C. for 24 hours, the maintenance rate of the thermal conductivity represented by the following Formula 3 can be 70% or more, 75% or more, 80% or more, and 90% or more.

(thermal conductivity of thermally conductive sheet after aging treatment/thermal conductivity of thermally conductive sheet before aging treatment)×100.   Formula 3:

The thermally conductive sheet according to the present technology can be obtained by applying a thermally conductive resin composition with a desired thickness on a release film formed of, for example, PET (polyethylene terephthalate), PEN (polyethylene naphthalate), polyolefin, polymethylpentene, glassine paper, or the like, and heating the composition to cure the binder resin (addition reaction type silicone resin). The thickness of the thermally conductive sheet can be appropriately selected according to the purpose, and it may be, for example, 0.05 to 5 mm.

As described above, since the thermally conductive sheet according to the present technology contains the above-described thermally conductive resin composition, the synergistic effect of the addition reaction type silicone resin, the thermally conductive filler, the alkoxysilane compound, and the specific carbodiimide compound makes it possible to maintain high thermal conductivity even when the thermally conductive resin composition contains 55 to 85% by volume of the thermally conductive filler.

In the heat radiation structure according to the present technology, a cured product of the above-described thermally conductive resin composition such as a thermally conductive sheet, is sandwiched between a heat-generating element and a heat dissipating member. Examples of the heat-generating element include an integrated circuit element such as a CPU (Central Processing Unit), a GPU (Graphics Processing Unit), a DRAM (Dynamic Random Access Memory), and a flash memory, and electronic components such as a transistor and a resistor that generate heat in an electric circuit. The heat-generating element also includes a component for receiving an optical signal such as an optical transceiver in a communication device. Examples of the heat dissipating member include a heat sink, a heat spreader used in combination with an integrated circuit element, a transistor, and an optical transceiver housing, among others. Further, the housing itself accommodating an electric circuit may be used as a heat dissipating member. In the heat radiation structure according to the present technology, for example, cured products of the above-described thermally conductive resin composition, particularly thermally conductive sheets, may be sandwiched between the integrated circuit element and the heat spreader, and between the heat spreader and the heat sink, respectively.

An article according to the present technology includes the above-described heat dissipating structure. Examples of the article having the heat dissipating structure include: a personal computer; a server device; a mobile phone; a radio base station; an engine, a power transmission system, and a steering system of a transportation machine such as an automobile; and an ECU (Electronic Control Unit) used for controlling electric components such as an air conditioner.

EXAMPLES

Examples of the present technology will be described below. In these Examples, thermally conductive resin compositions were prepared by using the materials shown in Table 1. The thermally conductive sheets obtained from the thermally conductive resin composition were subjected to the tests shown in Table 1. The present technology is not limited to the following examples.

Preparation of Thermally Conductive Resin Composition
The materials used in Examples are as follows.
Binder Resin
addition reaction type silicone resin: an addition reaction type silicone resin comprising a mixture of an organopolysiloxane having an alkenyl group, a platinum catalyst, and an organopolysiloxane having a hydrosilyl group.
Dispersant
alkyltrialkoxysilane: n-decyltrimethoxysilane (Z-6210, manufactured by Dow Corning Toray)
alkyltrialkoxysilane: hexadecyltrimethoxysilane (Dynasylan 9116, manufactured by Evonik Japan)
Hydrolysis Inhibitor
carbodiimide compound: CARBOSISTA TCC-FP 20M (manufactured by Teijin, solid 100% (fine powder))
oxazoline group-containing polymer: EPOCROS w-500 (Manufactured by Nippon Shokubai, nonvolatile content: 39%)
polyisocyanate: Coronate HX (manufactured by TOSOH, solid 100%)
carbodiimide compound: CARBODILITE (manufactured by Nisshinbo, nonvolatile 40%)
Antioxidant
phenol-based antioxidant (product name: AO-80 (manufactured by ADEKA))
sulfur-based antioxidant (product name: SUMILIZER (registered trademark) TP-D (manufactured by Sumitomo Chemical))
Thermally Conductive Filler
mixture of aluminum nitride, alumina (spherical alumina), and magnesium oxide
mixture of carbon fiber, aluminum Nitride, and zinc oxide Examples 1 to 4 and Comparative Examples 1 to 8

The silicone resin were stirred each time the thermally conductive fillers were added thereto one by one. A planetary mixer was used for stirring with the rotational speed at 1,200 rpm. Next, the thermally conductive resin composition was applied to a thickness of 2 mm using a bar coater, and heated at 80° C. for 6 hours to prepare a thermally conductive sheet. For example, in Comparative Example 1, as the thermally conductive filler, a mixture of 550 parts by weight of aluminum nitride, 365 parts by weight of alumina, and 650 parts by weight of magnesium oxide was used with respect to 100 parts by weight of silicone resin.

Example 5 and Comparative Example 9

In Example 5 and Comparative Example 9, the thermally conductive resin composition after stirring was poured into a mold (opening: 30 mm×30 mm) having a rectangular parallelepiped internal space by an extrusion molding method, and heated in an oven at 100° C. for 4 hours to form a molded block. The inner surface of the mold was release-treated by attaching a releasable polyethylene terephthalate film. The obtained molded block was sliced into a 1 mm thick sheet by an ultrasonic cutter to obtain a thermally conductive sheet in which carbon fibers were oriented in the thickness direction of the sheet.

Dispersibility
To a thermally conductive resin composition in which components other than thermally conductive fillers were mixed, thermally conductive fillers were added one by one and stirred. A commercially available planetary centrifugal mixer (planetary vacuum stirring deforming mixer (product name: V-mini 300, manufactured by EME)) was used for stirring with the rotational speed at 1,200 rpm. The time until the thermally conductive fillers were dispersed in the thermally conductive resin composition was evaluated. The results are shown in Table 1.
A: within 2 minutes
B: more than 2 minutes, within 4 minutes
C: more than 4 minutes, within 6 minutes
D: more than 6 minutes, within 10 minutes
E: not mixed at all even after stirring for more than 10 minutes Initial Thermal Conductivity
The initial thermal conductivity (W/m*K) in the thickness direction of the thermally conductive sheet was measured under a load of 1 kgf/cm$^2$ using a thermal resistance measuring device conforming to ASTM-D5470. The sheet temperature at the time of measurement was 45° C. The results are shown in Table 1.

Thermal Conductivity after Aging at 200° C. for 24 Hours

The thermal conductivity (W/m*K) in the thickness direction of the thermally conductive sheet after the aging at 200° C. for 24 hours (super-acceleration test) was measured. The results are shown in Table 1.

Initial Thermal Conductivity Maintenance Rate

When the thermally conductive sheet deteriorates due to the aging treatment, the thermally conductive sheet hardens and the contact resistance of the sheet surface increases, so that the apparent thermal conductivity decreases. Therefore, from the viewpoint of thermal conductivity and flexibility of the thermally conductive sheet, it is preferable that the initial thermal conductivity maintenance rate is high. The initial thermal conductivity maintenance rate (%) was determined from the thermal conductivity of the thermally conductive sheet before the aging treatment (initial thermal conductivity) and the thermal conductivity of the thermally conductive sheet after the aging treatment, as shown in Formula 3 described above. The results are shown in Table 1. In practice, the initial thermal conductivity maintenance rate is preferably 70% or more.

TABLE 1

| | | Product | Ex. 1 | Ex. 2 | Ex. 3 | Ex. 4 | Ex. 5 | Comp. 1 | Comp. 2 |
|---|---|---|---|---|---|---|---|---|---|
| Binder | addition-type silicone resin | — | 100.0 | 100.0 | 100.0 | 100.0 | 100.0 | 100.0 | 100.0 |
| Dispersant | alkyltrialkoxysilane | Z-6210 | 6.0 | 6.2 | 9.0 | 0 | 1.6 | 9.4 | 9.4 |
| | | Dynasylan 9116 | 0 | 0 | 0 | 8.8 | 0 | 0 | 0 |
| Antioxidant | hindered phenol-based antioxidant | AO-80 | 0 | 1.2 | 1.2 | 1.3 | 3.8 | 0 | 0.6 |
| | sulfur-based antioxidant | TP-D | 0 | 0 | 1.3 | 0.6 | 0 | 0 | 0 |
| Hydrolysis inhibitor | carbodiimide compound | CARBOSISTA TCC-FP20M | 0.9 | 1.0 | 0.1 | 0.6 | 0.3 | 0 | 0 |
| | oxazoline | EPOCROS w-500 | 0 | 0 | 0 | 0 | 0 | 0 | 0 |
| | isocyanate | Coronate HX | 0 | 0 | 0 | 0 | 0 | 0 | 0 |
| | carbodiimide compound | CARBODILITE | 0 | 0 | 0 | 0 | 0 | 0 | 0 |
| Thermally conductive filler | mixture of aluminum nitride, alumina, and magnesium oxide | — | 1468 | 1463 | 1468 | 1473 | 0 | 1563 | 1563 |
| | mixture of carbon fiber, aluminum nitride, and zinc oxide | — | 0 | 0 | 0 | 0 | 352 | 0 | 0 |
| | total | | 1675 | 1671 | 1680 | 1684 | 554 | 1772 | 1773 |
| | amount of thermally conductive filler (vol %) | | 80 | 80 | 80 | 80 | 55 | 80 | 80 |
| Composition evaluation | dispersibility | | A | A | A | B | A | A | A |
| Sheet evaluation | initial thermal conductivity (sheet temperature at the time of measurement: 45° C.) (W/m · K) | | 6.27 | 6.73 | 6.30 | 6.46 | 14.13 | 6.78 | 6.19 |
| | thermal conductivity after aging at 200° C. for 24 hours (super-acceleration test) (W/m · K) | | 4.76 | 6.11 | 4.70 | 6.42 | 12.40 | 0.81 | 1.67 |
| | initial thermal conductivity maintenance rate (%) | | 76 | 91 | 75 | 99 | 88 | 12 | 27 |

| | | Product | Comp. 3 | Comp. 4 | Comp. 5 | Comp. 6 | Comp. 7 | Comp. 8 | Comp. 9 |
|---|---|---|---|---|---|---|---|---|---|
| Binder | addition-type silicone resin | — | 100.0 | 100.0 | 100.0 | 100.0 | 100.0 | 100.0 | 100.0 |
| Dispersant | alkyltrialkoxysilane | Z-6210 | 6.0 | 5.8 | 6.1 | 6.0 | 1.3 | 9.0 | 1.5 |
| | | Dynasylan 9116 | 0 | 0 | 0 | 0 | 0 | 0 | 0 |
| Antioxidant | hindered phenol-based antioxidant | AO-80 | 0 | 0 | 0 | 1.2 | 1.3 | 1.2 | 0.9 |
| | sulfur-based antioxidant | TP-D | 0 | 0 | 0 | 0 | 0.9 | 1.3 | 0.0 |
| Hydrolysis inhibitor | carbodiimide compound | CARBOSISTA TCC-FP20M | 0 | 0 | 0 | 0 | 0 | 0.0 | 0.0 |
| | oxazoline | EPOCROS w-500 | 0.6 | 0 | 0 | 0 | 0 | 0 | 0 |
| | isocyanate | Coronate HX | 0 | 0 | 1.0 | 0 | 0 | 0 | 0 |
| | carbodiimide compound | CARBODILITE | 0 | 0.5 | 0 | 0 | 0.9 | 0 | 0 |

TABLE 1-continued

| | | | | | | | | | |
|---|---|---|---|---|---|---|---|---|---|
| Thermally conductive filler | mixture of aluminum nitride, alumina, and magnesium oxide | — | 1466 | 1469.8 | 1468 | 1467 | 1473 | 1468 | 0 |
| | mixture of carbon fiber, aluminum nitride, and zinc oxide | — | 0 | 0 | 0 | 0 | 0 | 0 | 352 |
| | total | | 1672 | 1676 | 1675 | 1675 | 1677 | 1680 | 555 |
| | amount of thermally conductive filler (vol %) | | 80 | 80 | 80 | 80 | 80 | 80 | 55 |
| Composition evaluation | dispersibility | | A | A | A | A | A | A | A |
| Sheet evaluation | initial thermal conductivity (sheet temperature at the time of measurement: 45° C.) (W/m · K) | | 6.34 | 6.58 | 6.15 | 6.45 | 6.43 | poor curing | 12.63 |
| | thermal conductivity after aging at 200° C. for 24 hours (super-acceleration test) (W/m · K) | | 2.64 | 2.88 | 3.40 | 2.10 | 3.18 | — | 6.63 |
| | initial thermal conductivity maintenance rate (%) | | 42 | 44 | 55 | 33 | 49 | — | 52 |

From Examples 1 to 5, it was found that, a thermally conductive sheet having an excellent initial thermal conductivity maintenance rate can be obtained from a thermally conductive resin composition containing an addition reaction type silicone resin, 55 to 85% by volume of a thermally conductive filler, an alkoxysilane compound, and a specific carbodiimide compound. Further, from Examples 1 to 5, it was found that a thermally conductive sheet having an excellent initial thermal conductivity maintenance rate can be obtained from a thermally conductive resin composition containing an addition reaction type silicone resin, a thermally conductive filler, an alkoxysilane compound, and a specific carbodiimide compound, wherein the thermally conductive resin composition exhibits a thermal conductivity of 5 W/m*K or more after curing. Thus, it has been found that the thermally conductive sheet obtained in Example 1 to 5 can maintain high thermal conductivity and flexibility even under a high temperature environment.

In particular, from Example 1 to 4, it was found that the initial thermal conductivity maintenance rate of the thermally conductive sheet was as good as 75% or more even when the content of the thermally conductive filler in the thermally conductive resin composition was 80% by volume and the initial thermal conductivity of the thermally conductive sheet was 5 W/m*K or more.

In contrast, in Comparative Example 1 to 9, in which the thermally conductive resin composition contains no specific carbodiimide compound, the initial thermal conductivity maintenance rate was not good. Specifically, in Comparative Examples 3 to 5 and 7, which use, in place of the specific carbodiimide compound, an oxazoline group-containing polymer, which is a crosslinking agent reacting with an alcohol or a carboxylic acid; a polyisocyanate; or a water-soluble carbodiimide compound having a nonvolatile content of 40% (a carbodiimide compound the a subcomponent of which is active to an alkoxysilane compound), the initial thermal conductivity maintenance rate was not good.

Further, from the results of Example 3 and Comparative Example 8, it was found that the thermally conductive resin composition according to the present technology not only has the effect of improving the initial thermal conductivity maintenance rate but also has the effect of being capable of forming a sheet even when the thermally conductive resin composition contains a sulfur-based antioxidant (secondary antioxidant). Specifically, in Comparative Example 8, in which the thermally conductive resin composition contains an addition reaction type silicone resin, an 80% by volume of thermally conductive filler, an alkoxysilane compound, a phenol-based antioxidant (primary antioxidant), and a sulfur-based antioxidant but not contains a specific carbodiimide compound, curing inhibition (poor curing) occurred, and the thermally conductive resin composition could not be formed into a sheet. On the contrary, in the thermally conductive resin composition of Example 3, which further contains a specific carbodiimide compound in the thermally conductive resin composition of Comparative Example 8, the curing inhibition was relaxed as compared with that of the thermally conductive resin composition of Comparative Example 8, and it was possible to form a sheet and to improve the initial thermal conductivity maintenance rate.

The invention claimed is:

1. A thermally conductive resin composition comprising:
an addition reaction type silicone resin;
a thermally conductive filler;
an alkoxysilane compound; and
a carbodiimide compound,
wherein the thermally conductive resin composition contains 55 to 85% by volume of the thermally conductive filler and
the carbodiimide compound is at least one selected from the group consisting of a cyclic carbodiimide compound and a xylylene polycarbodiimide.

2. The thermally conductive resin composition according to claim 1, wherein the thermally conductive filler contains a nitrogen compound having a thermal conductivity of 60 W/m*K or more.

3. The thermally conductive resin composition according to claim 1, wherein the thermally conductive filler comprises aluminum nitride.

4. The thermally conductive resin composition according to claim 1, wherein the alkoxysilane compound is an alkylalkoxysilane compound.

5. The thermally conductive resin composition according to claim 1, wherein the thermally conductive filler is a mixture of aluminum nitride, alumina and magnesium oxide.

6. A thermally conductive sheet comprising a cured product of the thermally conductive resin composition according to claim 1.

7. The thermally conductive sheet according to claim 6, wherein the maintenance rate of the thermal conductivity represented by Formula 3 below when aged at 200° C. for 24 hours is 70% or more:

(thermal conductivity of thermally conductive sheet after aging treatment/thermal conductivity of thermally conductive sheet before aging treatment)×100.   Formula 3:

8. A heat dissipating structure in which a cured product of the thermally conductive resin composition according to claim 1 is sandwiched between a heat-generating element and a heat dissipating member.

9. A heat dissipating structure in which a thermally conductive sheet according to claim 6 is sandwiched between a heat-generating element and a heat dissipating member.

10. An article comprising a heat dissipating structure according to claim 8.

11. The thermally conductive resin composition according to claim 2, wherein the thermally conductive filler comprises aluminum nitride.

12. The thermally conductive resin composition according to claim 2, wherein the alkoxysilane compound is an alkylalkoxysilane compound.

13. A thermally conductive resin composition comprising:
an addition reaction type silicone resin;
a thermally conductive filler;
an alkoxysilane compound; and
a carbodiimide compound,
wherein the thermally conductive resin composition contains 55 to 85% by volume of the thermally conductive filler,
the thermally conductive filler comprises at least one of aluminum nitride, metal hydroxide, metal oxide, and carbon fiber, and
the carbodiimide compound is at least one selected from the group consisting of a cyclic carbodiimide compound and a xylylene polycarbodiimide.

14. A thermally conductive resin composition containing:
an addition reaction type silicone resin;
a thermally conductive filler;
an alkoxysilane compound; and
a carbodiimide compound,
wherein the thermally conductive resin composition exhibits a thermal conductivity of 5 W/m*K or more after curing, and
the carbodiimide compound is at least one selected from the group consisting of a cyclic carbodiimide compound and a xylylene polycarbodiimide.

* * * * *